ial Patent [19] [11] 4,249,126
McConnell [45] Feb. 3, 1981

[54] ON-LINE FAULT LOCATOR FOR GAS-INSULATED CONDUCTORS WITH PLURAL DETECTORS

[75] Inventor: Lorne D. McConnell, Chalfont, Pa.
[73] Assignee: Gould Inc., Rolling Meadows, Ill.
[21] Appl. No.: 54,280
[22] Filed: Jul. 2, 1979
[51] Int. Cl.³ .............................................. G01R 31/10
[52] U.S. Cl. ........................................ 324/52; 324/51
[58] Field of Search .................. 324/133, 127, 52, 51, 324/54

[56] References Cited
U.S. PATENT DOCUMENTS
3,869,665  3/1975  Kenmouchi et al. ................ 324/133
4,063,171  12/1977  Schweitzer, Jr. ..................... 324/52

Primary Examiner—David K. Moore
Attorney, Agent, or Firm—Ostrolenk, Faber, Gerb & Soffen

[57] ABSTRACT

Current sensing coils are fixed to the grounded sheath of a gas-insulated conductor in pairs which preferably straddle the internal location of a support insulator. A plurality of such sensors may be disposed along the length of the conductor. The output of the pick-up coils is applied to a conventional electromagnetic target which can be operated from a target-off position to a target-on position in response to the axial flow of ground current through the housing in opposite directions from an insulator position as measured by any pair of pick-up elements. By then comparing the condition of the various targets on the system, one can determine the point at which fault current flowed from the main insulated conductor, across a faulted insulator and to the grounded housing. A local source of reset power may be provided to permit reset of the target, or an external magnetic pulsing device may be employed.

9 Claims, 2 Drawing Figures

ON-LINE FAULT LOCATOR FOR GAS-INSULATED CONDUCTORS WITH PLURAL DETECTORS

BACKGROUND OF THE INVENTION

This invention relates to gas-insulated systems, and more specifically relates to a novel arrangement for determining the location of an insulator which may have been subjected to flashover damage during an internal insulation failure.

Gas-insulated systems are well known and commonly consist of a high voltage central conductor which is contained within an outer elongated grounded housing which is filled with a high dielectric gas such as sulfur hexafluoride under positive pressure. Support insulators are positioned within the housing and are spaced along the length of the conductor to support the central conductor within its grounded outer housing.

Although it occurs infrequently, it is possible that the internal insulation system will fail. Once there is a failure, it is necessary to determine its exact location along the conductor so that the involved conductors and insulators can be repaired. Since all flashover damage is likely to be completely contained within the grounded metal housing, there is normally no outward indication of the location of the fault. Moreover, from relay and circuit breaker records which will be available at the electrical power station, it will be known only that a fault has occurred in a particular zone. Within this zone and on the faulted phase there may be a very large number of support insulators spaced, for example, about 25 feet along the length of the conductor and may also include a number of separate gas sections, disconnect switches, breaker terminals, and possibly line terminals. Thus, the location of the fault can be an extremely difficult, time-consuming and expensive task which is necessary before the repair can be carried out. Moreover, the repair becomes inordinately expensive when the repair procedure requires the opening of the gas-insulated sections for inspection only to determine whether the fault has occurred in a particular location.

The point of failure is most likely to be one of the support insulators since a power fault, if not initiated directly at an insulator, is likely to motor rapidly to an insulator.

In the past, numerous procedures have been used to try to locate the area of the fault after the fault has occurred. This has included energizing the line and then having personnel listen to the line at the various locations for the noise which would be associated with corona discharge or the like in the faulted region. This method is not too satisfactory and, moreover, when a line which has faulted is reenergized, it sometimes will give no indication of the existence of a damaged region and the damaged region may withstand system voltage for a short time before failing completely. Another system has been described in a paper F 79228-8, entitled "Dynamic Behavior of Metal Enclosures for Gas-Insulated Substations During Ground Faults and Their Immediate Location by Mechanical Means" by Tominaga et al. approved by the IEEE Substations Committee of the IEEE Power Engineering Society and to be presented at the IEEE PES Winter Meeting in New York Feb. 4–9, 1979. This paper discloses the use of mechanical devices for locating mechanical abnormalities along the length of a gas-insulated system.

The present invention provides a novel, simple and inexpensive sensor which can be located adjacent the location of every support insulator or adjacent selected support insulators along the length of a gas-insulated system. The sensors are operated in response to the presence of a non-zero magnetic field exterior to the grounded conductor housing of the system. This field will vary depending upon the location of a fault within the system and the location of ground connections to the system and the location of the sources of the power current infeed. However, by comparing the operation of the various sensors located along the line, one can immediately determine the exact location of a fault by determining those points along the grounded conductive sheath at which there appeared an instantaneous non-zero magnetic field.

In carrying out the present invention, two pairs of "exploring coils" are provided adjacent each insulator location and are associated with a conventional commercially available electromagnetic target assembly which consists of a permanent magnet and coil assembly. These assemblies may be located at any desired location in the gas-insulated system such as on the gas bus sections. The operation or non-operation of the indicators in the sensors would then be examined following the internal fault to provide a positive and visual indication of the position of the fault to the nearest insulator within the system or to a particular gas bus section between the insulators. Suitable reset means are provided to reset the targets after a fault condition has occurred.

DETAILED DESCRIPTION OF THE DRAWINGS

Figure 1:
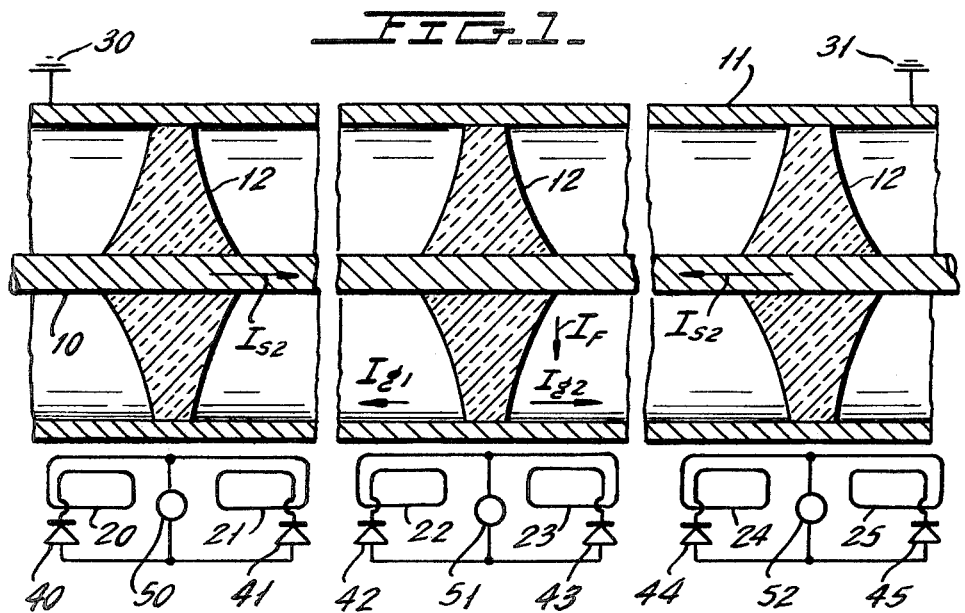
FIG. 1 is a cross-sectional view of a section of a gas-insulated bus which could be a part of a conventional gas-insulated substation and illustrates the location of exploring coils and target assemblies at locations adjacent each of the insulators in the system.

Referring first to FIG. 1, I have illustrated therein a conventional gas-insulated bus conductor which consists of a central conductor 10 which is mounted within an extending conductive grounded enclosure 11 which contains a suitable high dielectric gas therein such as sulfur hexafluoride under positive pressure. The invention could also be used at any desired location in a gas-insulated substation, as well as in the bus conductor.

The conductor 10 is supported from the outer housing 11 by conventional insulation spacers 12 which can be located at intervals, for example, of about 25 feet along the length of the housing. Other components could also be contained within the system which is to be monitored including disconnect switches, circuit breakers, and the like which are immersed in insulation gas and which are associated with support insulators and the like.

In accordance with the invention and at three locations which are axially aligned with and adjacent respective insulators in FIG. 1, there are provided pairs of exploring coils 20–21, 22–23 and 24–25. Each of coils 20–25 can be coils having about 50 turns of number 26 wire, with the coils aligned so that their axes are perpendicular to the axis of the housing 11. Housing 11 may be connected to ground at ground locations 30 and 31. The number of turns and wire size will be varied to obtain the desired level of sensitivity. In fact, it may be sufficient to make the detector sufficiently sensitive to respond to dielectric flashovers when no power fault current flows.

The coils 20 to 25 are insulated from the housing 11 but preferably are coupled as close as possible thereto so that a current will be induced in the coils in response to an axial flow of current along the length of the grounded housing 11 adjacent any given one of the coils.

Each of coils 20 to 25 is associated with a respective diode 40 to 45 and the circuits are then connected to appropriate permanent magnet sensors 50, 51 and 52 as shown in FIG. 1. Diodes 40 to 45 are provided to prevent a-c power from flipping or spinning the indicator disk which is provided in their respective permanent magnet target. The permanent magnet sensors 50, 51 and 52 are target sensors which may be of the type sold by Ferranti Company. One device which could be used and which is a dual coil type device is the device identified by the Ferranti catalog number 300613. Single coil versions are also available and are the type disclosed herein.

Figure 2:
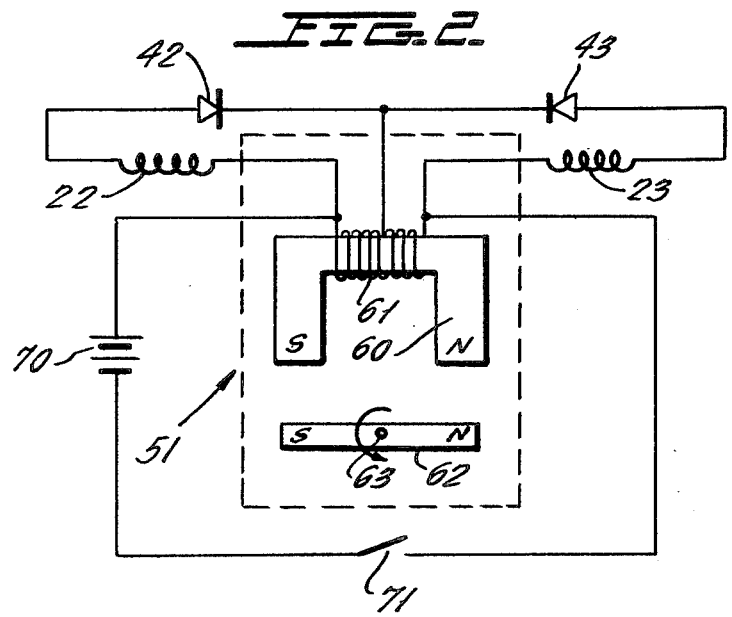
FIG. 2 is a circuit diagram showing the arrangement of two of the exploring coils of FIG. 1 with respect to its target assembly.

FIG. 2 shows the exploring coils 22 and 23 and their respective diodes 42 and 43 in connection with the pick-up device 51.

The permanent magnet target 51 as shown in FIG. 2 consists of a soft iron core 60 having a center tapped winding 61 connected as shown. The soft iron magnet 60 has its opposite legs spaced from the plane of a flat permanent magnet disk 62 which is pivotally mounted on the fixed pivot 63. The opposite surfaces of disk 62 may be different colors, for example, white and red, respectively, and the disk will be located with one or its other surface visible to view depending upon the prior energization of the soft magnet core 60. Thus, when the disk is in the reset position, the core may be magnetized to have its poles north and south as illustrated due to the remnant flux in core 60 so that the disk 62 will tend to be in its most counterclockwise position. Once, however, the windings 61 are energized so that the remnant flux in core 60 is reversed from that illustrated, the disk 62 will flip to its operated or indicating condition due to the reversal of the poles of the core 60.

In order to reset the disk to its reset position, a small battery 70 may be provided which is connected to the winding 61 through a momentary contact 71.

In operation, assume that a fault has occurred in the system of FIG. 1 and that a fault current $I_F$ was established across the insulator 12. This could have occurred because the fault was initiated at the insulator or the fault may have motored from the section between insulators 12 to the right-hand side of the central insulator 12 in FIG. 1. This fault current will be fed by the currents $I_{S1}$ and $I_{S2}$ which may come from both sides of the conductor 10 and into the fault region. Ground fault current $I_{G1}$ and $I_{G2}$ will flow in opposite directions from the central insulator 12 toward the grounds 30 and 31 respectively. Consequently, the magnetic fields seen by exploratory coils 22 and 23 will be in opposite directions so that the target 53 will be operated. The currents seen by coils 20 and 21 and by coils 24 and 25 are in the same direction so that these coils will not produce a net output signal for their sensors 50 and 52, respectively. Consequently, on inspection of the target system, the target 51 is operated (and may display its red surface) but targets 50 and 52 have not operated (and display their white surface) so that the fault is immediately located.

Clearly, any combination of operated and not-operated targets can give one information with respect to the occurrence and location of an internal fault within a given system and each system may be designed as desired.

It is to be noted that the target described herein requires only about 4.2 volts and 0.25 milliamperes for one millisecond in order to operate, which is approximately one milli-watt second. The operating coil is about 12 ohms so that sufficient power can be provided directly from the exploratory coils for the operation of any of the indicators used.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A fault locator for determining the location of a fault within an enclosed high voltage gas-insulated electrical system; said enclosed high voltage gas-insulated electrical system comprising a gas-filled, sealed grounded conductive outer housing, electrically conductive means disposed within and insulated from said conductive outer housing, and a plurality of spaced insulator supports connected between and supporting said electrically conductive means from said conductive outer housing; said fault locator including at least first and second current-sensing means magnetically coupled to detect differential fault current flow in said grounded metal housings and to respective first and second portions of said conductive outer housing on opposite sides of at least one of said plurality of spaced insulator supports for detecting current flow in said first and second portions of said conductive outer housing; and respective first and second indicator means connected to said first and second current-sensing means for indicating the detection of current by said first and second current-sensing means respectively.

2. The apparatus of claim 1 wherein said first and second sensing means each includes a first and second exploration coil which is fixed to said housing on opposite sides of the location of a respective one of said spaced insulator supports.

3. The apparatus of claim 1 wherein said first and second indicator means each comprise magnetically actuated targets.

4. The apparatus of claim 2 wherein said first and second indicator means each comprise magnetically actuated targets.

5. The apparatus of claim 1, 2 or 3 wherein said gas-insulated electrical system comprises an elongated bus having an elongated central bus conductor supported within a concentric extending grounded housing.

6. The apparatus of claim 1, 2 or 3 wherein said housing is filled with $SF_6$ gas under positive pressure.

7. The apparatus of claim 5 wherein said housing is filled with $SF_6$ gas under positive pressure.

8. The apparatus of claim 1, 2 or 3 wherein said system includes a plurality of current sensors and indicators therefor.

9. The apparatus of claim 8 wherein each of said support insulators is associated with a respective current sensor.

* * * * *